United States Patent
Kajihara et al.

(10) Patent No.: US 8,037,387 B2
(45) Date of Patent: Oct. 11, 2011

(54) CONVERSION DEVICE, CONVERSION METHOD, PROGRAM, AND RECORDING MEDIUM

(75) Inventors: Seiji Kajihara, Fukuoka (JP); Kohei Miyase, Fukuoka (JP); Xiaqing Wen, Fukuoka (JP); Yoshihiro Minamoto, Fukuoka (JP); Hiroshi Date, Fukuoka (JP)

(73) Assignees: Japan Science & Technology Agency, Saitama (JP); Kyushu Institute of Technology, Fukuoka (JP); System JD Co., Ltd., Fukuoka (JP)

( * ) Notice: Subject to any disclaimer, the term of this patent is extended or adjusted under 35 U.S.C. 154(b) by 209 days.

(21) Appl. No.: 12/345,310

(22) Filed: Dec. 29, 2008

(65) Prior Publication Data

US 2009/0113261 A1 Apr. 30, 2009

Related U.S. Application Data

(63) Continuation-in-part of application No. PCT/JP2007/062929, filed on Jun. 27, 2007.

(30) Foreign Application Priority Data

Jun. 30, 2006 (JP) .................................. 2006-180655

(51) Int. Cl.
*G06F 11/00* (2006.01)
(52) U.S. Cl. ........ 714/738; 714/741; 714/728; 714/729; 714/30; 714/724; 714/739; 716/4; 716/5; 716/18

(58) Field of Classification Search .................. None
See application file for complete search history.

(56) References Cited

U.S. PATENT DOCUMENTS

| | | | | |
|---|---|---|---|---|
| 6,968,286 B1 * | 11/2005 | Watkins | ........................ | 702/124 |
| 7,225,378 B2 * | 5/2007 | Ishida et al. | .................. | 714/741 |
| 7,685,491 B2 * | 3/2010 | Lin et al. | ....................... | 714/738 |
| 2006/0041810 A1 * | 2/2006 | Ishida et al. | .................. | 714/738 |
| 2007/0016836 A1 * | 1/2007 | Rajski et al. | .................. | 714/728 |
| 2009/0183041 A1 * | 7/2009 | Rajski et al. | .................. | 714/729 |
| 2010/0146350 A1 * | 6/2010 | Lin et al. | ....................... | 714/738 |

FOREIGN PATENT DOCUMENTS

JP 2001-04710 1/2001

OTHER PUBLICATIONS

International Search Report for PCT/JP2007/062929 dated Aug. 28, 2007.

\* cited by examiner

*Primary Examiner* — John Trimmings
(74) *Attorney, Agent, or Firm* — Rankin, Hill & Clark LLP

(57) ABSTRACT

Provided are a conversion device and the like for converting a initial test pattern given in advance into a test pattern of a bit constitution of different logic values, without losing the fault coverage of transition delay fault which can be detected by the constitution element of the initial test pattern. The conversion device converts an initial test pattern 100a given in advance for a logic circuit into an intermediate test pattern 100b of a bit constitution of different logic values, where the constitution elements of the initial test pattern 100a are at least two test vectors applied in succession. The conversion device includes a decision means for deciding a combination of logic values in the initial test pattern 100a which meet a detection condition of faults of the logic circuit which can be detected by applying the constitution elements.

15 Claims, 12 Drawing Sheets

Fig. 6

| Test cube | | Faults of target detection |
|---|---|---|
| $t_1$ | 0x1x | $f_1, f_5$ |
| $t_2$ | x101 | $f_2, f_4$ |
| $t_3$ | x11x | $f_3$ |
| $t_4$ | 1x0x | $f_6$ |
| $t_5$ | 101x | $f_7, f_8$ |
| $t_6$ | 01x0 | $f_9, f_{10}$ |

Test compaction ⬆

| Test cube | | Faults of target detection |
|---|---|---|
| $t'_1$ | 0110 | $f_1, f_3, f_5, f_9, f_{10}$ |
| $t'_2$ | 1101 | $f_2, f_4, f_6$ |
| $t'_3$ | 101x | $f_7, f_8$ |

| Name of circuit | #PIs | #PPIs | #tests | %X-ave | %X-max | %X-min | Number of faults | Detect number of faults | Time(sec) |
|---|---|---|---|---|---|---|---|---|---|
| s510 | 19 | 6 | 78 | 73.13 | 100 | 48 | 660 | 571 | 0.03 |
| s526 | 3 | 21 | 86 | 56.3 | 100 | 25 | 874 | 515 | 0.03 |
| s641 | 35 | 19 | 57 | 75.34 | 100 | 55.56 | 336 | 288 | 0.01 |
| s713 | 35 | 19 | 54 | 74.31 | 100 | 59.26 | 512 | 360 | 0.03 |
| s820 | 18 | 5 | 83 | 59.51 | 100 | 34.78 | 786 | 531 | 0.04 |
| s832 | 18 | 5 | 81 | 58.62 | 100 | 34.78 | 824 | 538 | 0.03 |
| s838 | 35 | 32 | 55 | 85.16 | 100 | 62.69 | 780 | 406 | 0.02 |
| s953 | 16 | 29 | 94 | 75.63 | 100 | 22.22 | 1234 | 1041 | 0.27 |
| s1196 | 14 | 18 | 34 | 66.64 | 100 | 31.25 | 216 | 198 | 0.03 |
| s1238 | 14 | 18 | 36 | 66.93 | 100 | 31.25 | 216 | 198 | 0.03 |
| s1423 | 17 | 74 | 166 | 69.83 | 100 | 17.58 | 2244 | 1925 | 0.8 |
| s1488 | 8 | 6 | 131 | 37.73 | 100 | 0 | 1200 | 1069 | 0.13 |
| s1494 | 8 | 6 | 129 | 34.5 | 100 | 0 | 1226 | 1080 | 0.14 |
| s5378 | 35 | 179 | 402 | 85.08 | 100 | 19.63 | 4948 | 4198 | 5.76 |
| s9234 | 19 | 228 | 992 | 86.62 | 100 | 46.56 | 10618 | 8632 | 31.1 |
| s13207 | 31 | 669 | 1030 | 96.51 | 100 | 38.71 | 14796 | 11779 | 43.64 |
| s15850 | 14 | 597 | 772 | 94.36 | 100 | 44.52 | 17568 | 12344 | 42.69 |
| s35932 | 35 | 1728 | 193 | 91.4 | 100 | 2.72 | 53340 | 44012 | 39.46 |
| s38417 | 28 | 1636 | 2360 | 96.35 | 100 | 51.62 | 48988 | 48016 | 382.64 |
| s38584 | 12 | 1452 | 2411 | 96.91 | 100 | 26.91 | 52112 | 43701 | 372.26 |
| Average | | | | 74.04 | 100.00 | 32.65 | | | |

| Name of circuit | #tests | | % (Percentage of compaction) |
| --- | --- | --- | --- |
| | Before compaction | After compaction | |
| s510 | 78 | 61 | 78.2 |
| s526 | 86 | 63 | 73.3 |
| s641 | 57 | 35 | 61.4 |
| s713 | 54 | 34 | 63.0 |
| s820 | 83 | 67 | 80.7 |
| s832 | 81 | 66 | 81.5 |
| s838 | 55 | 22 | 40.0 |
| s953 | 94 | 74 | 78.7 |
| s1196 | 34 | 26 | 76.5 |
| s1238 | 36 | 27 | 75.5 |
| s1423 | 166 | 114 | 68.7 |
| s1488 | 131 | 103 | 78.6 |
| s1494 | 129 | 106 | 82.2 |
| s5378 | 402 | 272 | 67.7 |
| s9234 | 992 | 619 | 62.4 |
| s13207 | 1030 | 555 | 53.9 |
| s15850 | 772 | 478 | 61.9 |
| s35932 | 193 | 72 | 37.3 |
| s38417 | 2360 | 1352 | 57.3 |
| s38584 | 2411 | 1499 | 62.2 |
| Average | | | 67.0 |

CONVERSION DEVICE, CONVERSION METHOD, PROGRAM, AND RECORDING MEDIUM

TECHNICAL FIELD

The present invention relates to a conversion device, a conversion method, a program capable of causing a computer to execute a conversion method, and a recording medium recording this program. More specifically, the present invention relates to a conversion device and the like for converting a test pattern given in adadvance for a logic circuit into a test pattern with a different bit constitution of logic values.

BACKGROUND ART

Here, an extraction technique of don't care bits in a test pattern suggested conventionally for detecting a stuck-at fault is described.

FIG. 10 is a schematic diagram of a full-scan sequential circuit in an ordinary logic circuit.

Generally, a semiconductor logic circuit is a sequential circuit in most cases. The sequential circuit is configured to include a combinational circuit portion 1201 constituted by logic elements such as an AND gate, a NAND gate, an OR gate and a NOR gate, and flip-flops 1203 each storing a circuit internal state. In this case, the combinational circuit portion 1201 includes primary input lines (PIs), pseudo primary input lines (PPIs) that are flip-flop output lines, primary output lines (POs), and pseudo primary output lines (PPOs) that are flip-flop input lines. Inputs to the combinational circuit portion 1201 include those directly applied from the primary input lines and those applied via the pseudo primary input lines. Further, outputs from the combinational circuit portion 1201 include those directly appearing on the primary output lines and those appearing on the pseudo primary output lines.

However, output lines (pseudo primary input lines) and input lines (pseudo primary output lines) of the flip-flops 1203 of the sequential circuit are usually inaccessible from outside. Due to this, to test the combinational circuit portion 1201 has problems of controllability over the pseudo primary input lines and observability of the pseudo primary output lines.

Full scan design is known as a main method of solving the problems of the controllability and the observability confronted by testing of the combinational circuit portion 1201. The full-scan design means replacing flip-flops by scan flip-flops and generating one or a plurality of scan chains using the scan flip-flops. Operations performed by the scan flip-flops are controlled by a scan enable (SE) signal line. For example, if SE=0, each of the scan flip-flops operates similarly to the conventional flip-flops. If a clock pulse is applied, an output value from each of the scan flip-flops is updated to a value from the combinational circuit portion 1201. Further, if SE=1, one scan flip-flop and another scan flip-flop in the same scan chain form one shift register. If a clock pulse is applied, a new value is loaded to the scan flip-flop through shift-in from the outside and, at the same time, a value currently present in the scan flip-flop is loaded to the outside through shift-out. Normally, the scan flip-flops belonging to the same scan chain share the same scan enable (SE) signal line. The scan flip-flops belonging to different scan chains either share the same scan enable (SE) signal line or use different scan enable (SE) signal lines.

A test is conducted on the combinational circuit portion of a full-scan sequential circuit by repeating scan shift and scan capture. The scan shift is performed in a shift mode in which a scan enable (SE) signal is set to a logic value 1. In the shift mode, one or a plurality of clock pulses is applied and one or a plurality of new values is loaded into the scan flip-flops in each scan chain through shift-in from the outside. At the same time, one or a plurality of values currently present in the scan flip-flops in the scan chain is loaded to the outside through shift-out. The scan capture is performed in a capture mode in which the scan enable (SE) signal is set to a logic value 0. In the capture mode, one clock pulse is applied simultaneously to all the scan flip-flops in one scan chain, and values of the pseudo primary output lines of the combinational circuit portion are loaded into all the scan flip-flops.

The scan shift is used to apply test vectors to the combinational circuit portion 1201 via the pseudo primary input lines and to observe a test response from the combinational circuit portion 1201 via the pseudo primary output lines. The scan capture is used to load the test response from the combinational circuit portion 1201 into the scan flip-flops. By repeating the scan shift and the scan capture for all the test vectors, the combinational circuit portion can be tested. A test method of this type is called "scan testing".

In the scan testing, application of test vectors to the combinational circuit portion 1201 includes direct application of test vectors from the primary inputs and application thereof by means of the scan shift. Since an arbitrary logic value can be set to an arbitrary scan flip-flop by the scan shift, the problem of the controllability over the pseudo primary input lines is solved. Observation of the test response from the combinational circuit portion 1201 includes observation made directly by the primary outputs and observation made by means of the scan shift. Since an output value from an arbitrary scan flip-flop can be observed by the scan shift, the problem of the observability over the pseudo primary output lines is solved. In this way, according to the scan testing, it suffices to obtain test vectors and an expected test response using an automatic test pattern generation (ATPG) program.

FIG. 11 is a schematic diagram showing a relation between test input and test response.

In FIG. 11, in a case where a don't care bit (X) exists in a test vector, a don't care thereby appears in test response, too. A don't care bit exists because determining only a part of logic values of bits of test input is enough to detect one or a plurality of stuck-at faults. A test vector having a don't care bit is also referred to as a test cube. A test cube can be obtained by ATPG or by don't care bits finding technique. Either logic value 0 or 1 can be freely assigned to a don't care bit.

Several techniques relating to extracting don't care bits are disclosed (Non-Patent Document 1-7). Here, the techniques according to Non-Patent Document 1 and 2 are briefly described.

According to Non-Patent Document 1, a technique based on a method referred to as bit-stripping is described. First, a fault simulation is executed to obtain all the faults F(v) which can be detected by only test vector v Next, the first bit of v is temporarily set as a don't care bit, and examine if F(v) can be actually detected by three value fault simulation. When F(v) can be detected, the bit is kept set as a don't care bit, otherwise the bit is set back to its original value. Don't care bits are extracted by repeating these procedures to all the bits.

According to Non-Patent Document 2, by using a part of procedures of fault simulation and ATPG, as many combinations of don't care bits as possible are obtained, keeping the fault coverage of an initial test pattern. The technique is briefly described below with an example. FIG. 12 is a circuit diagram showing an example of a case of identifying don't care bits in a test pattern.

When an initial test pattern for stuck-at faults is given, some bits in the initial test pattern may be changed to the opposite logic value without losing fault coverage. Such bits can be identified as don't-care bits. The example is shown in FIG. 12. Suppose that a test vector <a, b, c, d>=<1, 0, 0, 1> is given and it detects only the stuck-at 1 fault on signal line e. The test vector <a, b, c, d>=<1, 0, 0, 1> means that signal lines <a, b, c, d> are applied with values <1, 0, 0, 1>, respectively. Since the test vector <a, b, c, d>=<1, 0, 0, 1> has only to detect the stuck-at 1 fault on signal line e, logic value 0 on either signal line b or signal line c is unnecessary and one of the logic values can be changed into a don't-care bit. The necessary condition for detecting a stuck-at fault is to assure fault excitation and fault propagation.

First, considering fault excitation of the circuit in FIG. 12, detecting the stuck-at 1 fault on signal line e requires assigning logic value 0 to signal line e. So either signal line b or signal line c has to be assigned with logic value 0, but the other signal line can be assigned with either logic values 0 or 1 to assure the fault excitation. As a result, the signal line can be turned into a don't-care bit. In this example, signal line c is turned into a don't-care bit.

Next, as for the fault propagation, in FIG. 12, there are two propagation paths (e-f-h and e-g-i) from the fault site e to primary outputs (h and i). When there is a plurality of propagation paths as in this case, a propagation path can be chosen arbitrarily. In this example, the propagation path e-f-h is chosen. To activate this propagation path, the signal line a is needed to be assigned with logic value 1. Thereby, the stuck-at 1 fault on signal line e can be detectable by propagating to the primary output h. Thus, the residual signal line d can be treated as a don't-care bit. The obtained test cube <a, b, c, d>=<1, 0, X, X> is enough to detect the stuck-at 1 fault on line e, just as the test pattern <a, b, c, d>=<1, 0, 0, 1>. As explained, some bits in the test pattern can be changed into don't-care bits without losing fault coverage. With this scheme, a simulation is not carried out on all input bits. Due to this, the scheme of Non-Patent Document 2 is much shorter in test application time than that proposed by Non-Patent Document 1.

Non-Patent Document 1: R. Sankaralingam and N. A. Touba, "Controlling peak power during scan testing," Proceedings of the IEEE VLSI Test Symposium, pp. 153-159, 2002.

Non-Patent Document 2: S. Kajihara and K. Miyase, "On Identifying Don't Care Inputs of Test Patterns for Combinational Circuits," ICCAD-2001, pp. 364-369, Nov. 2001.

Non-Patent Document 3: A. El-Maleh and A. Al-Suwaiyan, "An efficient test relaxation technique for combinational & full-scan sequential circuits," Proceedings of IEEE VLSI Test Symposium, pp. 53-59, April 2002.

Non-Patent Document 4: A. El-Maleh and K. Al-Utaibi, "An efficient test relaxation technique for synchronous sequential circuits," Proceedings of IEEE VLSI Test Symposium, pp. 179, 185, April 2003.

Non-Patent Document 5: Y. Higami, S. Kajihara, S. Kobayashi, Y. Takamatsu, and, I. Pomeranz, "A method to find don't care values in test sequences for sequential circuits," Proceedings of IEEE International Conference on Computer Design, pp. 397-399, Oct. 2003.

Non-Patent Document 6: B. Koenemann, et. al., "A smart BIST variant guaranteed encoding," Proceedings of $10^{th}$ Asian Test Symposium, pp. 325-330, November 2001.

Non-Patent Document 7: H.-G. Liang, S. Hellebrand, and, H.-J. Wunderlich, "Two-dimensional test data compaction for scan-based deterministic BIST," Proceedings of IEEE International Test Conference, pp. 894-901, November 2001.

DISCLOSURE OF THE INVENTION

Problems to be Solved by the Invention

With the advances in DSM technologies in recently years, timing-related defects in VLSIs have been increasing. It is important to ensure the at-speed performance in test for VLSI circuits. It is impossible to detect timing-related defects with using a test pattern for stuck-at fault detection made based on stuck-at fault model. So an at-speed test in which models such as transition delay fault model and path delay fault model are used is needed. However, in at-speed test for delay fault model, the size of test pattern becomes enormous compared to that in conventional stuck-at fault test, thereby test application time increases. Moreover, the problem of increase of power consumption during test occurs, too.

Though detecting one stuck-at fault needs only one test vector, detecting one delay fault needs two test vectors. This is why the test pattern size for detecting delay faults is more than that for detecting stuck-at faults. Test pattern compaction techniques which utilize don't care bits in test patterns have been suggested as important keys to solve the problem of the increase of test pattern size.

However, since the technique described in Non-Patent Document 1 repeats fault simulations as many times as the number of bits in a test pattern, the process time is proportional to the number of faults, the number of test vectors, and the number of bits of test vectors. Thus, it is not realistic in terms of processing time to apply the technique to large circuits.

The technique described in Non-Patent Document 2, which is based on fault simulation and ATPG, takes less time than that of Non-Patent Document 1. But this technique assumes the detection of stuck-at faults. A technique to extract don't care bits for detecting delay fault has not been suggested.

All the techniques described in Non-Patent Document 3-7 also target the test patterns for detecting stuck-at faults and their applicabilities to the test pattern for detecting delay faults are not assured.

It is, therefore, an object of the present invention, to solve the above-stated problems, to provide a conversion device for converting an initial test pattern given in advance without losing the transition delay fault coverage which can be realized with the constitution elements into a test pattern with a different bit constitution of logic values, a conversion method, a program enabling a computer to execute the conversion method, and a recording medium recording this program.

Means for Solving the Problems

A first aspect in accordance with the present invention provides a conversion device for converting a test pattern which is given in advance for a logic circuit and which has a plurality of test vectors detecting a transition delay fault, before applying the test pattern to the logic circuit, into a new test pattern which detects the transition delay fault and which has a different bit constitution of logic values from that of the test pattern given in advance, including the test pattern given in advance whose constitution elements being N (N≧2) test vectors scheduled to be applied successively to the logic circuit, the N (N≧2) test vectors constituting the constitution elements being test vectors where relations of bits between each test vector are not necessarily inversion relations and where bits in each test vector are not necessarily aligned alternately; and decision means for deciding a combination of logic values of bits which cannot be identified as don't care bits, the combination of logic values are in the test pattern given in advance which satisfies a condition for detection of a transition delay fault of the logic circuit which can be detected by applying the constitution elements, the condition for detection determined with N-time-frame model (N≧2), the decision means for deciding a combination of logic values in a test pattern which satisfies both of two conditions which are the conditions for detection of a transition delay fault and which consist of an initial condition which is needed before a signal value changes and a condition for checking a signal value after a signal value changes.

A second aspect in accordance with the present invention provides the conversion device according to the first aspect in accordance with the present invention, further including don't care identification means for identifying a logic value of a bit, which is not included in the combination of logic values decided by the decision means, as don't care.

A third aspect in accordance with the present invention provides a conversion method for converting a test pattern which is given in advance for a logic circuit and which has a plurality of test vectors detecting a predetermined fault, before applying the test pattern to the logic circuit, into a new test pattern which detects the fault and which has a different bit constitution of logic values from that of the test pattern given in advance, including the test pattern given in advance whose constitution elements being N (N≧2) test vectors scheduled to be applied successively to the logic circuit, the N (N≧2) test vectors constituting the constitution elements being test vectors where relations of bits between each test vector are not necessarily inversion relations and where bits in each test vector are not necessarily aligned alternately; and a decision step wherein decision means decides a combination of logic values of bits which cannot be identified as don't care, the combination of logic values being in the test pattern given in advance which satisfies a condition for detection of a fault of the logic circuit which can be detected by applying the constitution elements, the decision step deciding a combination of logic values in the test pattern given in advance which satisfies the condition for detection of a fault of the logic circuit which can be detected by applying the constitution elements, the condition for detection determined with N-time-frame model (N≧2).

A fourth aspect in accordance with the present invention provides the conversion method according to the third aspect in accordance with the present invention, wherein, in the decision step, the decision means decides a combination of logic values in a test pattern which satisfies both of two conditions which are the conditions for detection of a fault and which consist of an initial condition which is needed before a signal value changes and a condition for checking a signal value after a signal value changes.

A fifth aspect in accordance with the present invention provides the conversion method according to the third or the fourth aspect in accordance with the present invention, further including a don't care identification step for identifying a logic value of a bit which is not included in a combination of logic values decided by the decision means as don't care.

A sixth aspect in accordance with the present invention provides a program capable of causing a computer to execute the conversion method according to any one of the third, the fourth, or the fifth aspect in accordance with the present invention.

A seventh aspect in accordance with the present invention provides a recording medium recording the program according to the sixth aspect in accordance with the present invention so as to be able to cause a computer to execute the program.

EFFECTS OF THE INVENTION

According to the present invention, since an efficient technique of reducing the size of test patterns by compaction for detecting transition delay faults is realized, it is possible to reduce of transition delay fault by remedying the problem of the increase of the size of test patterns for detecting transition delay faults.

Besides, according to the present invention, it is also possible to reduce the power consumption during test by converting a test pattern into a test pattern which reduces power consumption during test. This is useful to prevent the yield from decreasing.

Further, according to the present invention, it is also possible to add new characteristics such as being compacted to a converted test pattern without losing the fault coverage of an initial test pattern given in advance.

Further, according to the present invention, since the size of test patterns for detecting delay faults gets smaller, it is also possible to execute tests to detect delay faults which have been impossible to execute tests enough because the test pattern sizes are so large that their test takes too much time. Therefore, the quality of semiconductor devices improves by executing tests of defective semiconductor devices which have been shipped as non-defective products because of shortage of tests.

Further, the method of the present invention is applicable to overall semiconductor devices to which full scan design is applied because the method does not depend on the system of scan circuit, the kind of clocks, or the number of clocks. That is, the method is also applicable to semiconductor devices which have a plurality of scan chains, to semiconductor devices which have a plurality of clocks which drive scan circuits, and to semiconductor devices whose timing are various to load values from the combinational circuit portion of the full-scan sequential circuit to flip flops.

BRIEF DESCRIPTION OF THE DRAWINGS

FIG. 6 is a simple circuit diagram showing an example of how to determine combination of logic values of a test pattern and how to identify don't care bits FIG. 7 is a diagram showing an example of process of test compaction.

FIG. 8 is a table showing an experimental result of identification of don't care bits for an initial test pattern.

DESCRIPTION OF REFERENCE SYMBOLS

100a Initial test pattern
100b Intermediate test pattern

BEST MODE FOR CARRYING OUT THE INVENTION

The summary of the present invention is described below. The present invention is a test technique to assure the performance of at-speed test in the tests of VLSI. And the present invention is essentially means for identifying don't care bits in a test pattern based on information of transition delay faults which can be detected by each test vector of an initial test pattern given in advance. The present invention is applicable, for example, to compaction of given test patterns by merging each test vector without losing fault coverage. And the present invention can be used not only to compaction of test patterns but also used for other various purposes such as to convert a given test pattern into a test pattern to avoid error of test resulted from power supply voltage drop owing to increase of power consumption during capture mode of scan flip flops.

Figure 1:
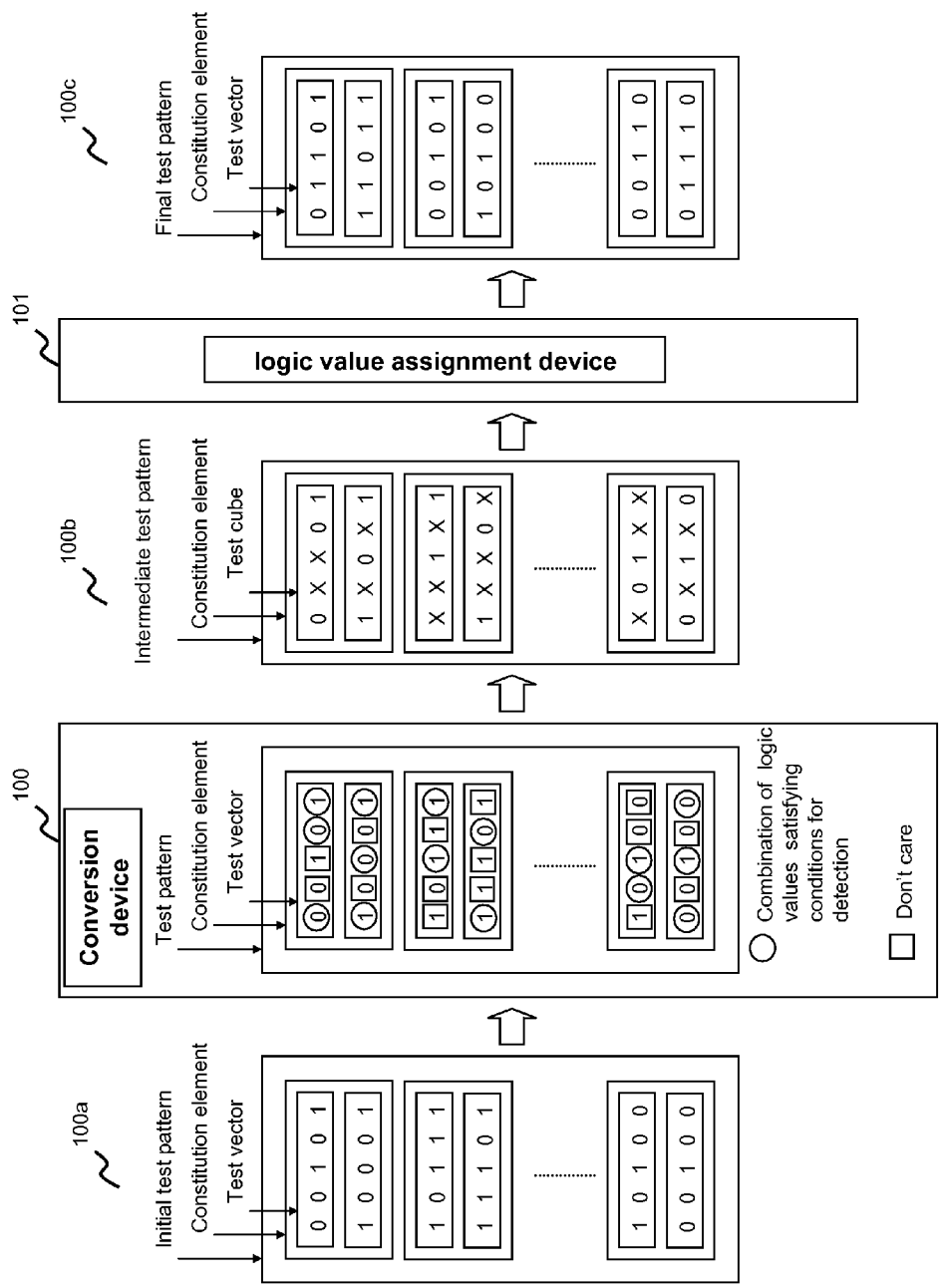
FIG. 1 is a schematic diagram of the present invention.

FIG. 1 is a schematic diagram of the present invention.

In FIG. 1, an initial test pattern 100a is a test data given in advance which is generated by techniques such as ATPG. The initial test pattern 100a includes a plurality of constitution elements and each constitution element includes at least two test vectors. In FIG. 1, each constitution element includes just two test vectors. To detect one transition delay fault, two successive test vectors are needed as in FIG. 1. For the initial test pattern 100a, by a conversion device 100 as shown in FIG. 1, a combination of logic values (surrounded by circles in FIG. 1) which satisfy conditions for detecting faults is determined and don't care bits (surrounded by squares in FIG. 1) are identified at the same time.

Conversion device 100 generates an intermediate test pattern 100b. Intermediate test pattern 100b includes a plurality of constitution elements and each of the constitution elements includes two test cubes.

Logic value assignment device 101 assign logic values to the don't care bits of generated intermediate test patterns 100b. Logic value assignment device 101 is, for example, a device for compacting test data or a device for reducing power consumption during test. Such logic value assignment devices assign appropriate logic values to don't care bits in accordance with respective purposes.

Test data where logic values are assigned to all the don't care bits is converted into a final test pattern 100c. A final test pattern 100c, as well as an initial test pattern 100a, includes a plurality of constitution elements and each constitution element includes two test vectors. However the data contents of final test pattern 100c is different from that of initial test pattern 100a. The fault coverage of the final test pattern 100c is not less than that of the initial test pattern 100a and the test pattern 100c is a test pattern with new characteristics, obtained by conversion, such as less test data volume by compaction or less power consumption during test.

Next, embodiments of the present invention are described below.

In the present invention, the conversion of test pattern to detect transition delay fault is performed. There are two well known ways to detect transition delay faults. One of them is called launch-off-shift testing and the other is called broadside test (launch-off-capture testing). In the present invention, broad-side test (launch-off-capture testing) is used to detect transition delay faults. Here, the broad-side test that starts to be widely used in at-speed test of transition delay fault model is described. In at-speed test, broad-side test is used because of its controllability of clock-timing. It is usually required to apply two-pattern test in delay test. First pattern is called initialization pattern, and second pattern is called launch pattern. Using broad-side testing, the launch pattern is obtained from the test response for the initialization pattern. In other words, the launch pattern is heavily dependent on the initialization pattern. Thus, it may happen that a desirable launch pattern cannot be obtained. However, it is easier to control clock-timing in broad-side testing than in launch-off shift testing, so broad-side testing is commonly adopted to detect delay faults. In order to deal with the transition faults in using broad-side testing in a similar manner to the manner in dealing with the stuck-at faults described in BACKGROUND ART, two-time-frame model is often used.

For the present invention, don't care bits are identified for an initial test pattern for detecting transition delay faults based on broad-side testing. At first, two-time-frame model in order to deal with transition faults just as dealing with stuck-at faults described in BACKGROUND ART. Two-time-frame model enables to expand don't-care identification for the test patterns for detecting stuck-at faults to don't-care identification for the test patterns for detecting transition delay faults.

Figure 2:
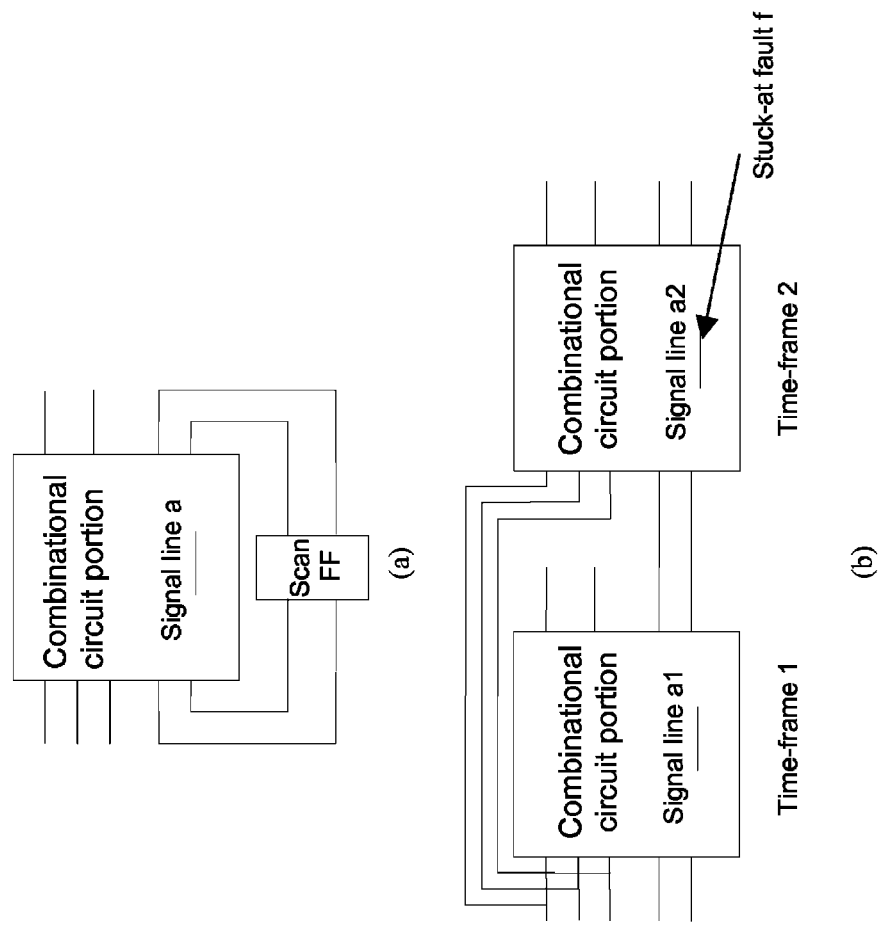
FIG. 2 is a diagram of circuit structure of two-time-frame expansion of targeted circuit of test.

In order to conduct don't-care identification when the broad-side testing is used, a circuit-under-test is expanded to the two-time-frame model. FIG. 2 shows the circuit structure of two-time-frame expansion. Two-time-frame model is a model where logic function in each time-frame is expanded spatially. For a circuit of two-time-frame model, the concept of clock disappears and the circuit is expressed like one big combination circuit. Time-frame 1 is considered as the initialization phase, and time-frame 2 is treated as the launch phase. The launch pattern is obtained from the initialization pattern.

Next, the condition is defined how the delay faults are recognized as being able to be detected. The condition for delay fault detection can be formulated clearly. Using the formulation, don't care bits can be identified for an initial test pattern for detecting transition delay faults.

Here, the conditions for detection of transition delay faults are described. To detect a transition delay fault f on line a, detection of a stuck-at fault on a signal line a2, which corresponds to the signal line a in time-frame 2, is needed. To assure a fault excitation in time-frame 2, the values of the line a need to have opposite values between in time-frame 1 and in time-frame 2. So the opposite value to a2 has to be assured on the line a1 in time-frame 1. When stuck-at 1 fault is assumed on the line a2, the detection of the fault can be regarded as detection of rising transition delay faults. When stuck-at 0 fault is assumed on the line a2, the detection of the fault can be regarded as detection of falling transition delay fault. Thus, detection conditions of the transitional delay faults are clearly formulated as follows:

Detecting a rising fault f on signal line a
(1) The stuck-at 0 fault on the signal line a2 can be detected.
(2) The opposite value to that of signal line a2 can be assigned on the signal line a1.

Detecting a falling fault f on signal line a
(1) The stuck-at 1 fault on the signal line a2 can be detected.
(2) The opposite value to that of signal line a2 can be assigned on the signal line a1.

By adding the above conditions of detection to stuck-at fault detection method shown in BACKGROUND ART, it is possible to identify don't-care bits in initial test patterns for transition delay fault without losing the fault coverage of the original test patterns.

Satisfying the conditions (1) and (2) is enough to be able to detect targeted transition delay faults.

Next, there are structurally undetectable faults in a two-time-frame circuit, so these are excluded from target faults. Reducing target faults directly contributes to shortening computing time of the proposed method in the present invention.

In case of at-speed testing, there may be restrictions in obtaining the launch pattern. For example, there may be a restriction which prohibit the logic values of primary inputs from changing between for time-frame 1 and for time-frame 2. Thereby, there are some lines where the values in time-frame 1 are always the same as the values in time-frame 2. This is caused by the existence of the signal line values obtained from only values applied to the primary inputs. Thus, there is a possibility for the transition delay faults of a signal line to be detected, if and only if the signal line values are obtained from the logic values applied to at least one pseudo primary inputs. The other faults are never detected under such restriction. Therefore, in the present invention, because there are structurally undetectable faults, these faults are excluded from target faults. Hence, the target faults in the present invention are only the ones that have possibility of being detected in at-speed testing.

Conversion devices and compaction devices according to an embodiment of the present invention are described below.

Figure 3:
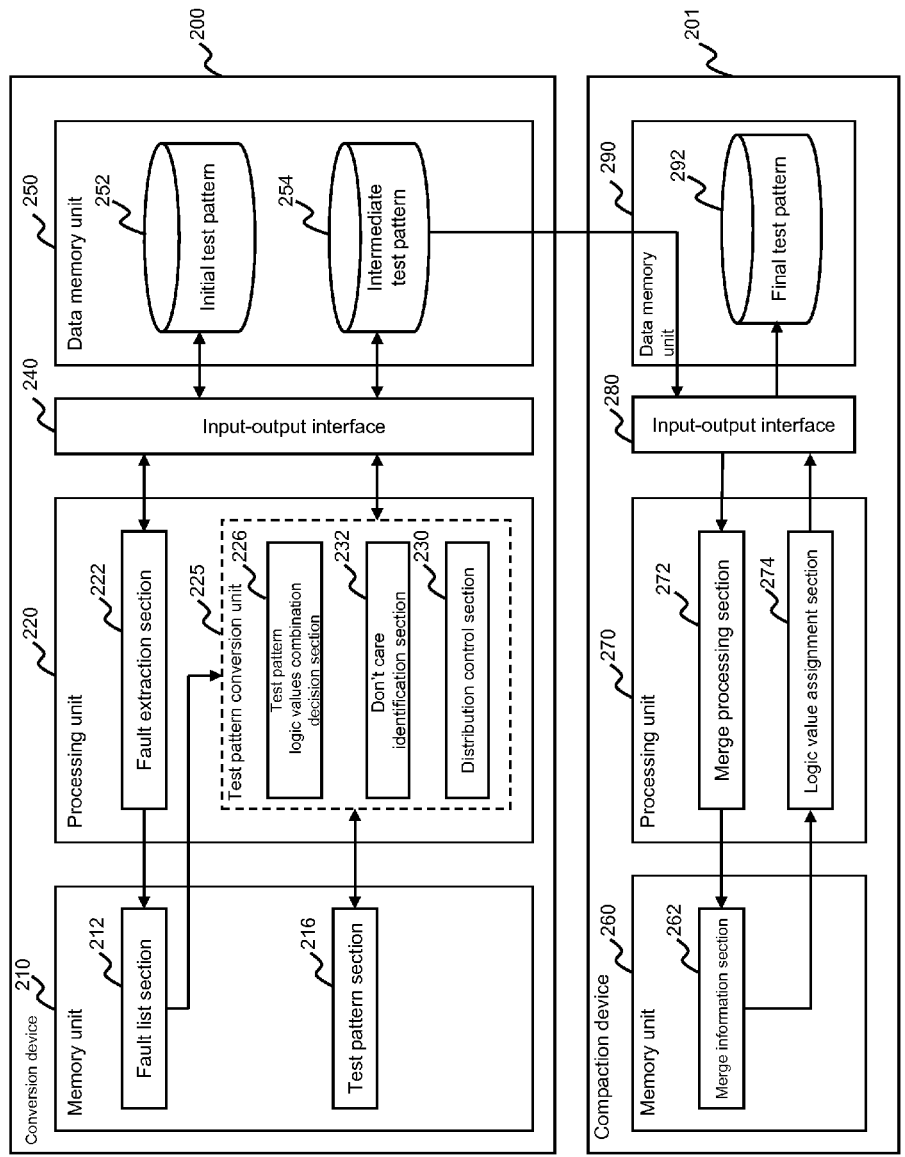
FIG. 3 is a block diagram showing an example of constitutions of conversion device and compaction device according to an embodiment of the present invention.

FIG. 3 is a block diagram showing an example of conversion device and compaction device according to an embodiment of the present invention.

Conversion device 200 includes memory unit 210, processing unit 220, input-output interface 240, and data memory unit 250. Memory unit 210 includes fault list section 212 and test pattern section 216. Processing unit 220 includes fault extraction section 222 and test pattern conversion unit 225. Test pattern conversion unit 225 includes test pattern logic values combination decision section 226, don't care identification section 232, and distribution control section 230. Data memory unit 250 includes initial test pattern 252 and intermediate test pattern 254.

Compaction device 201 includes, as well as conversion device 200, memory unit 260, processing unit 270, input-output interface 280, and data memory unit 290. Memory unit 260 includes merge information section 262. Processing unit 270 includes merge processing section 272 and logic value assignment section 274. Data memory unit 290 includes final test pattern 292.

The brief overview of the process of conversion device 200 and compaction device 201 is described below. Initial test pattern 252 is applied into fault extraction section 222 via input-output interface 240 of conversion device 200. The fault extraction section 222 extract fault list of the applied initial test pattern 252 and hold the list in fault list section 212 of memory unit 210. Test pattern conversion unit 225 decides combination of logic values of test patterns while controlling distribution of don't care bits based on the information held in the fault list section 212. The decided test pattern is held in test pattern section 216. And based on the information held in the test pattern section 216, don't care bits are identified by don't care identification section 232 and intermediate test pattern 254 including the don't care bits is held in data memory unit 250.

Compaction device 201 memorizes the data of intermediate test pattern 254 generated by conversion device 200 in data memory unit 290. The intermediate test pattern 254 is applied into merge processing section 272 of processing unit 270 via input-output interface 280 of compaction device 201. Merge processing unit 272 merges test vectors based on the inputted data, and the merged data is held in merge information section 262 of memory unit 260. Logic value assignment section 274 assigns logic values to don't care bits among the information held by merge information section 262, resulting in final test pattern 292.

Figure 4:
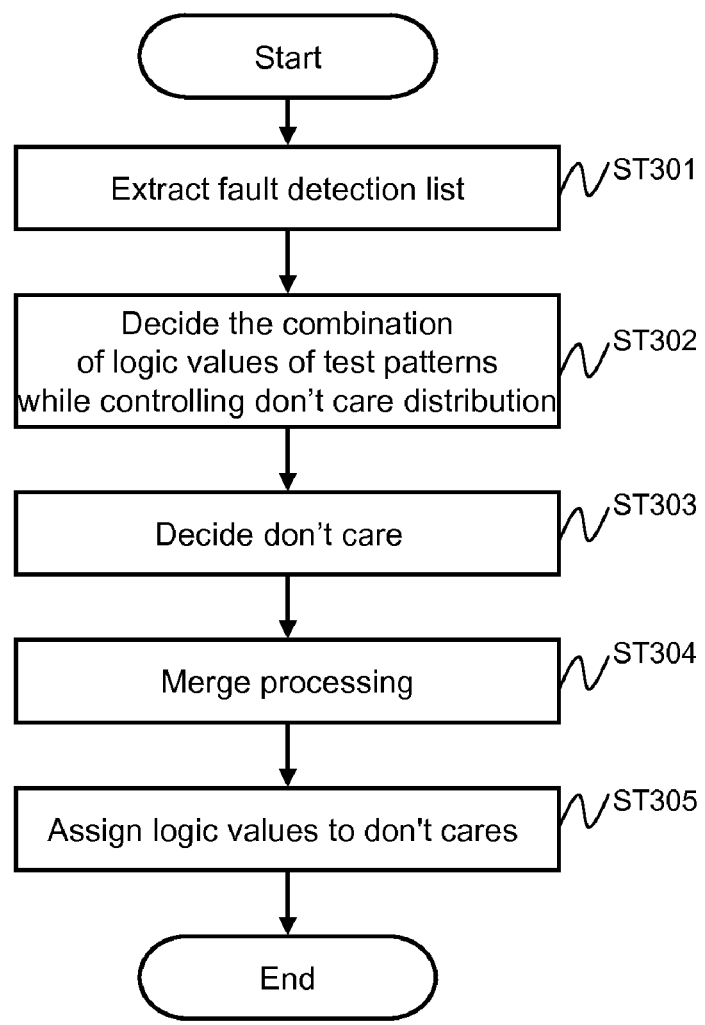
FIG. 4 is a flow chart showing an example of process of conversion device and compaction device according to an embodiment of the present invention.

FIG. 4 is a flow chart showing an example of process of conversion device and compaction device according to an embodiment of the present invention.

At first, in step ST301, target faults, which are targets of detection, are extracted by fault extraction section 222 using data of initial test pattern 252 in FIG. 3. The extracted list of targeted faults is held in fault list section 212. In step ST302, based on the information held in the fault list section 212, combination of logic values of test pattern is decided by test pattern logic value combination decision section 226. At the same time, distribution control section 230 controls distribution of targeted faults. In step ST303, don't care identification section 232 identify logic values of bits, which are not included in bits decided in step ST302, as don't care.

Figure 5:
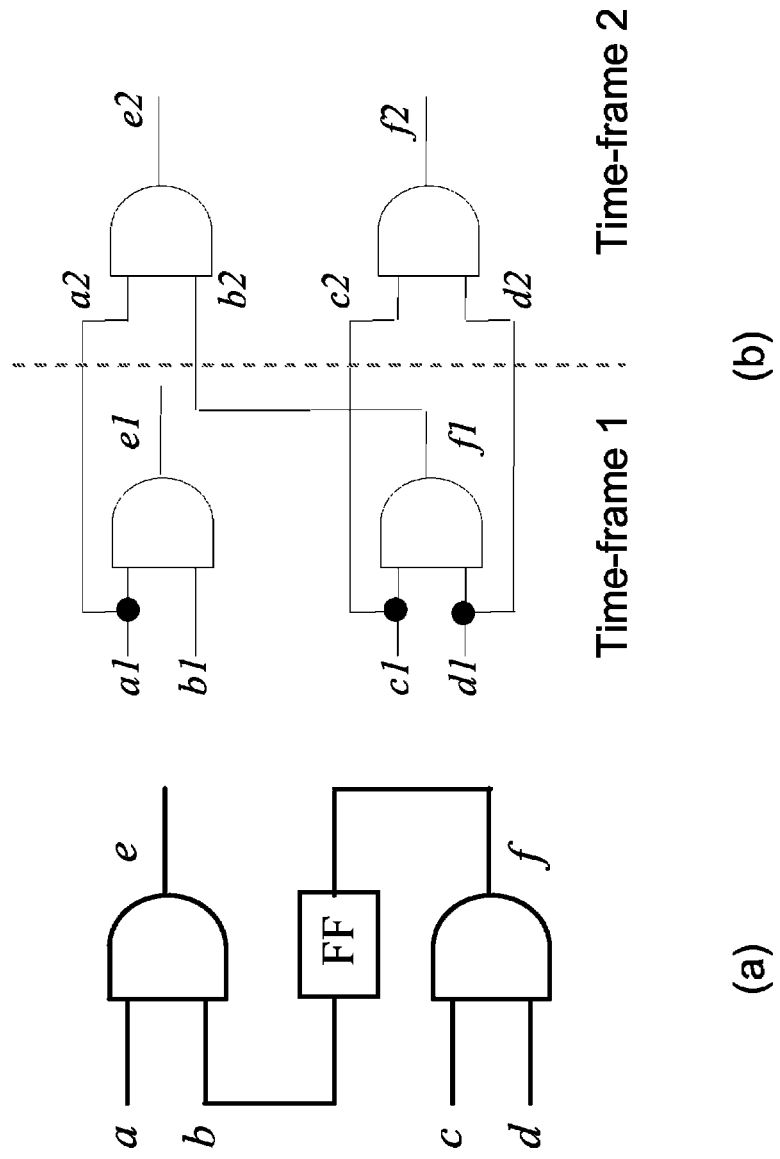
FIG. 5 shows a flow chart explaining further the don't care identification step ST303 in FIG. 4.

FIG. 5 shows a flow chart explaining further the don't care identification step ST303 in FIG. 4.

Initial test vector set is given to don't care identification section 232 in FIG. 3 and don't care identification step ST303 starts. In step ST3031, fault simulation is performed to specify the faults which each test vector should detect. Next, in step 3032, whether there is an unprocessed test vector or not is judged. If there is an unprocessed test vector, step ST3033 is performed and a test cube is generated with regard to the test vector. The process ST3033 includes the following steps of ST30331, ST30332, and ST30333. In step ST30331, the propagation paths of the faults which should be detected are specified. In step ST 30332, the internal signal values necessary for fault excitation and fault propagation are justified. In step 30333, the don't care bits necessary for fault detection are extracted. When step ST3033 is finished, the process returns to step ST3032. And if there is not an unprocessed test vector, don't care identification step ST303 is finished and a test cube is generated.

Here, decision of combination of logic values of test pattern and identification of don't care bits are described in detail.

FIG. 6 shows simple circuits diagram to explain one example of decision method of combination of values of test pattern and don't care identification method. FIG. 6 (b) shows the two-time-frame circuit expanded from FIG. 6(a). The circuit in FIG. 6 shows an example of how don't-care bits in the test pattern can be identified.

First, a test vector <a1, b1, c1, d1>=<1, 1, 0, 0> is given to primary inputs (a, c, d) and pseudo primary input (b). This test vector <a1, b1, c1, d1>=<1, 1, 0, 0> is needed to find only falling transition delay fault on signal line b in time-frame 1. To detect the falling transition fault, logic value 1 has to be assigned to signal line b1, and the stuck-at 1 fault on signal line b2 has to be assured with fault excitation and fault propagation. To propagate the fault effect to the output, logic value 1 has to be assigned to signal line a2. And to excite the stuck-at 1 fault on signal line b2, logic value 0 has to be assigned to signal line b2. Thus, logic value 0 has to be assigned to either signal line c1 or d1. The logic values of the rest signal lines can be identified as don't-care bits. In this example, logic value 0 is assigned to signal line c1. So the value of signal line d1 is identified as a don't-care bit. The test cube <a1, b1, c1, d1>=<1, 1, 0, X> can be obtained from the test vector <a1, b1, c1, d1>=<1, 1, 0, 0> and the test cube detects the same fault. If don't care identification is performed for the test vector <a1, b1, c1, d1>=<1, 0, 1, 1> which detects a rising transition delay fault on signal line b, no don't care bits will be identified. This is because all the logic values in the test vector are needed to detect the rising transition delay fault on signal line b.

In FIG. 4 again, when don't cares bits are identified in step ST303 and intermediate test pattern 254 including don't care bits are generated, merge process is executed, in step ST304, by merge processing section 272 of compaction device 201 in FIG. 3. The intermediate test pattern 254 is compacted by this merge process and held in merge information section 262.

Here, test compaction is described below.

The don't care bits identified in intermediate test pattern can be used for various purposes. One of the efficient use is to use don't care bits for test compaction. It is significantly efficient use because compacting test patterns reduces test data volume, thereby test application time becomes shorter, too.

When an intermediate test pattern which includes don't care bits is given, there are test cubes that can be merged without losing fault coverage. By test compaction, two or more test patterns can be merged and treated as one test pattern, hence the size of test pattern can be reduced. In FIG. 7, the way how a test pattern which includes don't-care bits is merged is described.

FIG. 7 shows an example of the process of test compaction. The test cube $t_1$<0, X, 1, X,> can be merged with the test cube $t_3$<X, 1, 1, X> into a test cube <0, 1, 1, X>. And the test cube <0, 1, 1, X> can be further merged with the test cube $t_6$<0, 1, X, 0>. Finally the test cube $t'_1$<0, 1, 1, 0> can be obtained. As shown in FIG. 7, the test cube $t'_1$<0, 1, 1, 0> can detect all the faults that are detected by the test cubes $t_1$, $t_3$, and $t_6$. So the number of the test cubes can be reduced without losing fault coverage. In the same way, a test cube $t'_2$<1, 1, 0, 1> is obtained by merging $t_2$<X, 1, 0, 1> and $t_4$<1, X, 0, X>. A test cube $t'_3$<1, 0, 1, X> is the same with a test cube $t_5$<1, 0, 1, X>. Because there is no test cube which can be merged with the test cube $t_5$, the test cube $t_5$ remains as $t'_3$. Eventually the test pattern <$t'_1$, $t'_2$, $t'_3$> can be obtained. The test pattern has the same fault coverage with that of the test pattern <$t_1$, $t_2$, $t_3$, $t_4$, $t_5$, $t_6$>. But the number of test cubes is reduced from 6 to 3. So test data volume is reduced by half.

There may be another better combination of merging test patterns, but finding the best combination of merging is an NP-complete problem. There are some effective heuristic algorithms to find a better combination, but they take a lot of time to calculate. So in the embodiment of the present invention, test patterns which can be merged are searched and merged by simply descending sequence at the top of the test patterns. The process finishes in $O(n^2)$, and good effect of compaction can be obtained in a short time.

In FIG. 4 again, in step ST305, final test pattern 292 is generated by assigning logic values to don't care bits and the process is finished.

Hereinafter, experimental results of the present invention are shown.

In this experiment, the inventors implemented the proposed method using C programming language on a PC (OS: FreeBSD 4.11 Release, CPU: Athlon XP 1800+1.53 GHz, memory: 768 MB), and applied to ISCAS' 89 benchmark circuits. For the experiment, a test pattern generated for transition delay faults using the broadside testing is used. The test pattern is obtained by the following way. Here, it is supposed that the logic values applied to primary input in time-frame 1 and in time-frame 2 cannot be changed, and that faults can be detected only on pseudo primary output and cannot be detected on primary output.

First, a target fault is selected, a test pattern is generated for the fault, and a fault simulation is performed using the test pattern. Then, test generation for the faults detected by the test pattern is not needed, and the number of times of test generation can be reduced. The test pattern can be obtained by repeating the procedure above until target faults which need test generation and not yet detected go out. The target fault set consists of only the faults that exist on the lines that logic values can be changed from the initialization phase to the launch phase. The other faults are regarded as permanently undetectable as far as the broadside testing is used, and they are excluded.

FIG. 8 shows the result of don't-care identification to the initial test pattern. The first column in FIG. 8 shows the circuit name. The following three columns show the number of primary inputs, the number of pseudo primary inputs, and the number of test vectors of given test pattern, respectively. The next three columns show the average percentage of don't-care bits identified for each test pattern, the percentage of don't-care bit of the test vector including the most don't-care bits among each test pattern, and the percentage of don't-care bit inputs of the test vector including the least don't-care bits among each test pattern, respectively. The next two columns show the number of target faults, and the number of faults which are detected by the given test pattern, respectively. The last column shows CPU time in second.

In the present invention, for a given test pattern, more than 74% of don't-care bits in the test pattern are identified. The column % X-max shows that test patterns of some these circuits include a test cube which consists of only don't care bits is included after don't care identification. These test cubes can be deleted or used for enhancement of test quality. The column % X-min shows that test patterns of some these circuits include a test vector which does not include any don't-care bits.

For these test vectors, all the input values are fully used for detecting transition delay faults. CPU time depends on the number of test vectors of the given test pattern and circuit size. This is because the method in the present invention processes test patterns in serial.

Figure 9:
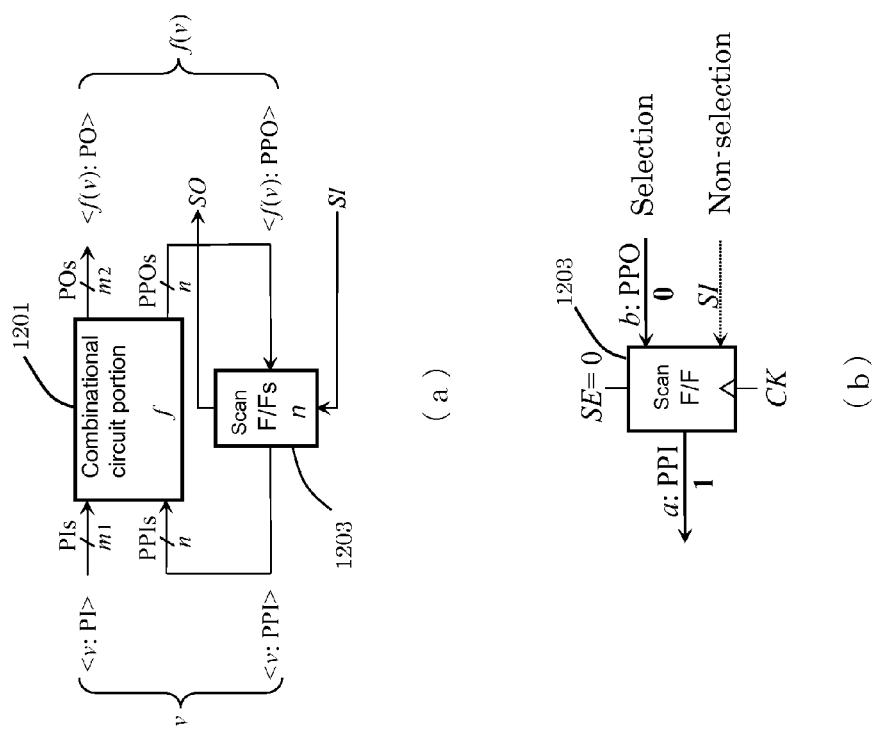
FIG. 9 is a table showing an experimental result of test compaction for the test pattern whose don't care bits have been identified in the experiment shown in FIG. 8.
Figure 10:
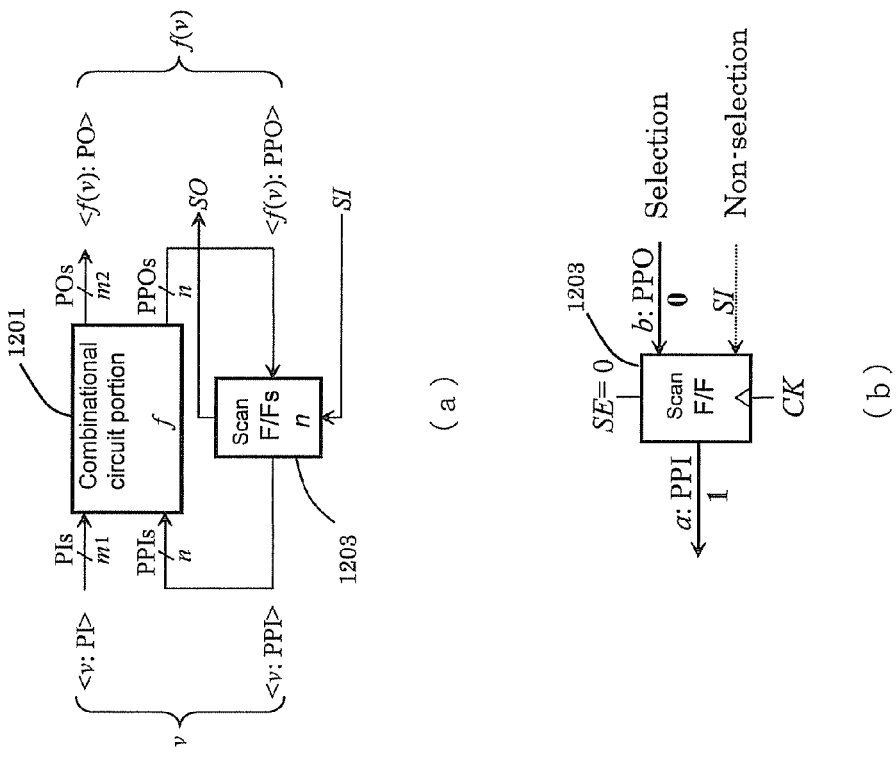
FIG. 10 is a schematic diagram showing a configuration of an ordinary full-scan sequential circuit.
Figure 11:
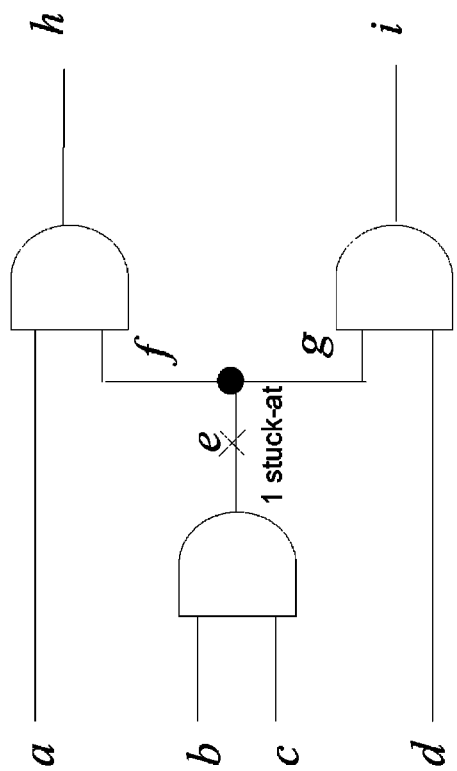
FIG. 11 is a schematic diagram showing the relation between test input and test response.
Figure 12:
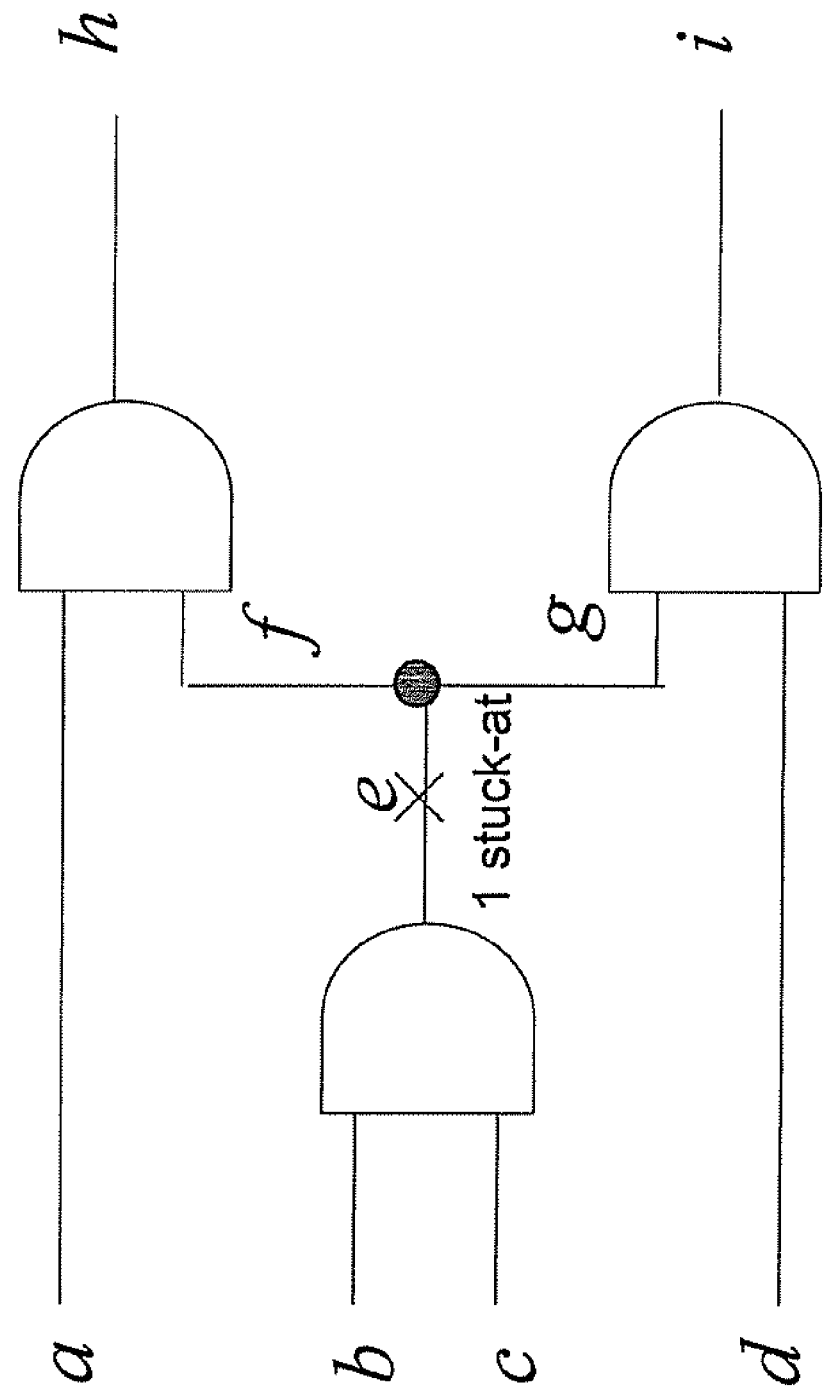
FIG. 12 is a circuit diagram showing an example of identifying don't care bits in a test pattern.

FIG. 9 shows a table of the experimental results of test compaction for the test patterns whose don't care bits are identified in the experiment shown in FIG. 8. In this experiment, for test compaction, the inventors use a simply descending sequence as described above. The first column in FIG. 9 shows the circuit name. The next column "#test" shows the number of test vectors in the test pattern before compaction and the number of test vectors in the test pattern after compaction. The column "% compaction rate" shows the percentage of the number of test vectors after test compaction to that of the given test pattern. This result shows that the given test pattern is compacted to 67% of the original one. It needs only a few seconds of CPU time for large circuits shown in FIG. 9.

In the result of the embodiment, more than 74% of don't-care bits in the test pattern are also identified. And the result of the embodiment showed good test compaction result for the test pattern identifying don't-care bits. It shows the effectiveness of don't-care bits identification in the test pattern.

In the embodiment of the present invention, delay faults are detected by two test vectors applied successively, using two-time-frame model. Faults can be detected by N test vectors applied successively. And, N-time frame model may be used alternatively. The detected faults in these cases are not necessarily delay faults.

In the embodiment of the present invention, transition delay faults are detected. Alternatively, the present invention is also applicable to faults which can be detected by a plurality of test patterns such as path delay fault, cross talk fault, stuck open fault, bridging fault, and so on.

Furthermore, combination of logic values of a test pattern which satisfies the conditions may be the whole of the test pattern or only a part of the test pattern.

In the embodiment of the present invention, conversion device and compaction device are indicated separately. Alternatively they may be considered as one device.

Furthermore, the compaction device in the embodiment of the present invention may be a device for assigning logic values to don't care bits to reduce maximum power consumption during test, a device for assigning logic values to don't care bits to reduce average power consumption during test, a device for assigning logic values to don't cares to detect a targeted fault N times, and so on. In these cases, conversion device and these devices may be considered as one device.

What is claimed is:

1. A conversion device for converting a test pattern which is given in advance for a logic circuit and which has a plurality of test vectors detecting a transition delay fault, before applying the test pattern to the logic circuit, into a new test pattern which detects the transition delay fault and which has a different bit constitution of logic values from that of the test pattern given in advance, comprising:

the test pattern given in advance whose constitution elements being N (N≧2) test vectors scheduled to be applied successively to the logic circuit, the N (N≧2) test vectors constituting the constitution elements being test vectors where relations of bits between each test vector are not necessarily inversion relations and where bits in each test vector are not necessarily aligned alternately;

logic value combination decision means for deciding a combination of logic values of bits which cannot be identified as don't care bits, the combination of logic values are in the test pattern given in advance which satisfies a condition for detection of a transition delay fault of the logic circuit which can be detected by applying the constitution elements, the condition for detection determined with an N-time-frame model (N≧2), the logic value combination decision means for deciding a combination of logic values in the test pattern given in advance which satisfies both of two conditions which are the conditions for detection of the transition delay fault and which consist of an initial condition which is needed before a signal value changes and a condition for checking the signal value after the signal value changes; and don't care identification means for identifying a logic value of a bit, which is included in the test pattern given in advance but is not included in the combination of logic values decided by the logic value combination decision means, as don't care, wherein the new test pattern comprises the combination of logic values decided by the logic value combination decision means and the don't care identified by the don't care identification means, and the test pattern given in advance is converted into the new test pattern with less deterministic logic values than those of the test pattern given in advance.

2. The conversion device according to claim 1, further comprising merging means that merges two or more test cubes of the new test pattern into one test cube to produce a second new test pattern by assigning a logic value 0 or 1 to the don't care of the two or more test cubes of the new test pattern.

3. A conversion method for converting a test pattern which is given in advance for a logic circuit and which has a plurality of test vectors detecting a predetermined fault, before applying the test pattern to the logic circuit, into a new test pattern which detects the fault and which has a different bit constitution of logic values from that of the test pattern given in advance, comprising:

the test pattern given in advance whose constitution elements being N (N≧2) test vectors scheduled to be applied successively to the logic circuit, the N (N≧2) test vectors constituting the constitution elements being test vectors where relations of bits between each test vector are not necessarily inversion relations and where bits in each test vector are not necessarily aligned alternately;

a logic value combination decision step wherein logic value combination decision means decides a combination of logic values of bits which cannot be identified as don't care bits, the combination of logic values being in the test pattern given in advance which satisfies a condition for detection of a fault of the logic circuit which can be detected by applying the constitution elements, the logic value combination decision step deciding a combination of logic values in the test pattern given in advance which satisfies the condition for detection of a fault of the logic circuit which can be detected by applying the constitution elements, the condition for detection determined with an N-time-frame model (N≧2); and a don't care identification step wherein don't care identification means identifies a logic value of a bit, which is included in the test pattern given in advance but is not included in the combination of logic values decided by the logic value combination decision means, as don't care, wherein the new test pattern comprises the combination of logic values decided by the logic value combination decision means and the don't care identified by the don't care identification means, and the test pattern given in advance is converted into the new test pattern with less deterministic logic values than those of the test pattern given in advance.

4. The conversion method according to claim 3, wherein, in the logic value combination decision step, the logic value combination decision means decides a combination of logic values in the test pattern given in advance which satisfies both of two conditions which are the conditions for detection of a fault and which consist of an initial condition which is needed before a signal value changes and a condition for checking the signal value after the signal value changes.

5. The conversion method according to claim 3, further comprising a merging step wherein merging means merges two or more test cubes of the new test pattern into one test cube to produce a second new test pattern by assigning a logic value 0 or 1 to the don't care of the two or more test cubes of the new test pattern.

6. A conversion method, implemented in a computer, for converting a test pattern which is given in advance for a logic circuit and which has a plurality of test vectors detecting a predetermined fault, before applying the test pattern to the logic circuit, into a new test pattern which detects the fault and which has a different bit constitution of logic values from that of the test pattern given in advance, comprising:

the test pattern given in advance whose constitution elements being N (N≧2) test vectors scheduled to be applied successively to the logic circuit, the N (N≧2) test vectors constituting the constitution elements being test vectors where relations of bits between each test vector are not necessarily inversion relations and where bits in each test vector are not necessarily aligned alternately;

a logic value combination decision step wherein logic value combination decision means decides a combination of logic values of bits which cannot be identified as don't care bits, the combination of logic values being in the test pattern given in advance which satisfies a condition for detection of a fault of the logic circuit which can be detected by applying the constitution elements, the logic value combination decision step deciding a combination of logic values in the test pattern given in advance which satisfies the condition for detection of a fault of the logic circuit which can be detected by applying the constitution elements, the condition for detection determined with an N-time-frame model (N≧2); and a don't care identification step wherein don't care identification means identifies a logic value of a bit, which is included in the test pattern given in advance but is not included in the combination of logic values decided by the logic value combination decision means, as don't care, wherein the new test pattern comprises the combination of logic values decided by the logic value combination decision means and the don't care identified by the don't care identification means, and the test pattern given in advance is converted into the new test pattern with less deterministic logic values than those of the test pattern given in advance.

7. The conversion method, implemented in a computer, according to claim 6, wherein the conversion method further includes a merging step wherein merging means merges two or more test cubes of the new test pattern into one test cube to produce a second new test pattern by assigning a logic value 0 or 1 to the don't care of the two or more test cubes of the new test pattern.

8. A recording medium recording a conversion method to be used by a computer to execute the conversion method, the conversion method for converting a test pattern which is given in advance for a logic circuit and which has a plurality of test vectors detecting a predetermined fault, before applying the test pattern to the logic circuit, into a new test pattern which detects the fault and which has a different bit constitution of logic values from that of the test pattern given in advance, comprising:

the test pattern given in advance whose constitution elements being N (N≧2) test vectors scheduled to be applied successively to the logic circuit, the N (N≧2) test vectors constituting the constitution elements being test vectors where relations of bits between each test vector are not necessarily inversion relations and where bits in each test vector are not necessarily aligned alternately;

a logic value combination decision step wherein logic value combination decision means decides a combination of logic values of bits which cannot be identified as don't care bits, the combination of logic values being in the test pattern given in advance which satisfies a condition for detection of a fault of the logic circuit which can be detected by applying the constitution elements, the logic value combination decision step deciding a combination of logic values in the test pattern given in advance which satisfies the condition for detection of a fault of the logic circuit which can be detected by applying the constitution elements, the condition for detection determined with an N-time-frame model (N≧2); and a don't care identification step wherein don't care identification means identifies a logic value of a bit, which is included in the test pattern given in advance but is not included in the combination of logic values decided by the logic value combination decision means, as don't care, wherein the new test pattern comprises the combination of logic values decided by the logic value combination decision means and the don't care identified by the don't care identification means, and the test pattern given in advance is converted into the new test pattern with less deterministic logic values than those of the test pattern given in advance.

9. The recording medium according to the claim 8, wherein the conversion method further includes a merging step wherein merging means merges two or more test cubes of the new test pattern into one test cube to produce a second new test pattern by assigning a logic value 0 or 1 to the don't care of the two or more test cubes of the new test pattern.

10. A conversion device for converting a test pattern which is given in advance for a logic circuit, before applying the test pattern to the logic circuit, into a new test pattern, wherein the test pattern which is given in advance has a plurality of test vectors detecting a transition delay fault, the new test pattern detects the transition delay fault; and the new test pattern has a different bit constitution of logic values from that of the test pattern which is given in advance the conversion device, comprising:

the test pattern given in advance whose constitution elements being N (N≧2) test vectors scheduled to be applied successively to the logic circuit, the N (N≧2) test vectors constituting the constitution elements being test vectors where relations of bits between each test vector are not necessarily inversion relations and where bits in each test vector are not necessarily aligned alternately;

logic value combination decision means for deciding a combination of logic values of bits which cannot be identified as don't care bits, the combination of logic values are in the test pattern given in advance which satisfies a condition for detection of a transition delay fault of the logic circuit which can be detected by applying the constitution elements, the condition for detection determined with N-time-frame model (N≧2), the logic value combination decision means for deciding a combination of logic values in the test pattern given in advance which satisfies both of two conditions which are the conditions for detection of a transition delay fault and which consist of an initial condition which is needed before a signal value changes and a condition for checking the signal value after the signal value changes; and don't care identification means for identifying a logic value of a bit, which is included in the test pattern given in advance but is not included in the combination of logic values decided by the logic value combination decision means, as don't care, wherein the new test pattern comprises the combination of logic values decided by the logic value combination decision means and the don't care identified by the don't care identification means, and the test pattern given in advance is converted into the new test pattern with less deterministic logic values than those of the test pattern given in advance.

11. The conversion device according to claim 10, wherein the combination of logic values of bits which cannot be identified as don't care bits decided by the logic value combination decision means includes a logic value of a bit propagating effect of a stuck-at fault related to the transition delay fault to output or a logic value of a bit exciting the stuck-at fault.

12. The conversion device according to claim 10, further comprising merging means that merges two or more test cubes of the new test pattern into one test cube to produce a second new test pattern by assigning a logic value 0 or 1 to the don't care of the two or more test cubes of the new test pattern.

13. A conversion method for converting a test pattern which is given in advance for a logic circuit, before applying the test pattern to the logic circuit, into a new test pattern, wherein the test pattern which is given in advance has a plurality of test vectors detecting a predetermined fault, the new test pattern detects the fault, the new test pattern has a different bit constitution of logic values from that of the test pattern given in advance; and the test pattern given in advance has constitution elements being N (N≧2) test vectors scheduled to be applied successively to the logic circuit, the N (N≧2) test vectors constituting the constitution elements being test vectors where relations of bits between each test vector are not necessarily inversion relations and where bits in each test vector are not necessarily aligned alternately, comprising:

a logic value combination decision step wherein logic value combination decision means decides a combination of logic values of bits which cannot be identified as don't care bits, the combination of logic values being in the test pattern given in advance which satisfies a condition for detection of a fault of the logic circuit which can be detected by applying the constitution elements, the logic value combination decision step deciding a combination of logic values in the test pattern given in advance which satisfies the condition for detection of a fault of the logic circuit which can be detected by applying the constitution elements, the condition for detection determined with N-time-frame model (N≧2); and a don't care identification step wherein don't care identification means identifies a logic value of a bit, which is included in the test pattern given in advance but is not included in the combination of logic values decided by the logic value combination decision means, as don't care, wherein the new test pattern comprises the combination of logic values decided by the logic value combination decision means and the don't care identified by the don't care identification means, and the test pattern given in advance is converted into the new test pattern with less deterministic logic values than those of the test pattern given in advance.

14. The conversion method according to claim 13, wherein the combination of logic values of bits which cannot be identified as don't care bits decided by the logic value combination decision means includes a logic value of a bit propagating effect of a stuck-at fault related to the transition delay fault to output or a logic value of a bit exciting the stuck-at fault.

15. The conversion method according to claim 13, further comprising a merging step wherein merging means merges two or more test cubes of the new test pattern into one test cube to produce a second new test pattern by assigning a logic value 0 or 1 to the don't care of the two or more test cubes of the new test pattern.

* * * * *